(12) United States Patent
Deppe et al.

(10) Patent No.: US 7,094,648 B2
(45) Date of Patent: Aug. 22, 2006

(54) METHOD FOR FABRICATING AN NROM MEMORY CELL ARRAY

(75) Inventors: Joachim Deppe, Dresden (DE);
Christoph Kleint, Dresden (DE);
Christoph Ludwig, Langebruck (DE);
Josef Willer, Riemerling (DE)

(73) Assignees: Infineon Technologies AG, Munich (DE); Infineon Technologies Flash GmbH & Co. KG, Dresden (DE)

( * ) Notice: Subject to any disclaimer, the term of this patent is extended or adjusted under 35 U.S.C. 154(b) by 0 days.

(21) Appl. No.: 11/023,041

(22) Filed: Dec. 27, 2004

(65) Prior Publication Data

US 2005/0164456 A1 Jul. 28, 2005

Related U.S. Application Data

(63) Continuation of application No. PCT/DE03/01965, filed on Jun. 12, 2003.

(30) Foreign Application Priority Data

Jun. 28, 2002 (DE) ................................ 102 29 065

(51) Int. Cl.
*H01L 21/8236* (2006.01)
(52) U.S. Cl. ...................... 438/275; 438/244; 438/268
(58) Field of Classification Search ........ 438/275–278, 438/243–249, 268–270
See application file for complete search history.

(56) References Cited

U.S. PATENT DOCUMENTS

| | | | |
|---|---|---|---|
| 5,229,312 A | 7/1993 | Mukherjee et al. | |
| 5,768,192 A | 6/1998 | Eitan | |
| 5,972,747 A | 10/1999 | Hong | |
| 6,011,725 A | 1/2000 | Eitan | |
| 6,013,551 A | 1/2000 | Chen et al. | |
| 6,025,626 A | 2/2000 | Tempel | |
| 6,060,740 A | 5/2000 | Shimizu et al. | |
| 6,215,148 B1 | 4/2001 | Eitan | |
| 6,348,711 B1 | 2/2002 | Eitan | |
| 6,349,052 B1 | 2/2002 | Hofmann et al. | |
| 6,384,451 B1 | 5/2002 | Caywood | |
| 6,477,084 B1 | 11/2002 | Eitan | |
| 6,548,861 B1 | 4/2003 | Palm et al. | |
| 6,664,588 B1 | 12/2003 | Eitan | |
| 6,794,249 B1 * | 9/2004 | Palm et al. | 438/259 |
| 2002/0024092 A1 | 2/2002 | Palm et al. | |

(Continued)

FOREIGN PATENT DOCUMENTS

WO  WO 99/43029 A1  8/1999

(Continued)

OTHER PUBLICATIONS

Tanaka, J., et al., "A Sub-0.1-μm Grooved Gate MOSFET with High Immunity to Short-Channel Effects," IEDM 1993, pp. 537-540.

(Continued)

*Primary Examiner*—H. Jey Tsai
(74) *Attorney, Agent, or Firm*—Slater & Matsil L.L.P.

(57) ABSTRACT

In the method, trenches are etched and, in between, bit lines (8) are in each case arranged on doped source/drain regions (3, 4). Storage layers (5, 6, 7) are applied and gate electrodes (2) are arranged at the trench walls. After the introduction of polysilicon, which is provided for the gate electrodes (2), into the trenches, the top side is ground back in a planarizing manner until the top side of the covering layer (16) is reached, and afterward a polysilicon layer (18), which is provided for the word lines, is applied over the whole area and patterned to form the word lines.

19 Claims, 5 Drawing Sheets

U.S. PATENT DOCUMENTS

2003/0006428 A1 1/2003 Palm et al.
2003/0015752 A1 1/2003 Palm et al.

FOREIGN PATENT DOCUMENTS

WO WO 99/60631 A1 11/1999
WO WO 02/15276 A2 2/2002

OTHER PUBLICATIONS

Nakagawa, K., et al., "A Flash EEPROM Cell with Self-Asigned Trench Transistor & Isolation Structure," 2000 IEEE Symposium on VLSI Technology Digest of Technical Papers, 2 pages.

* cited by examiner

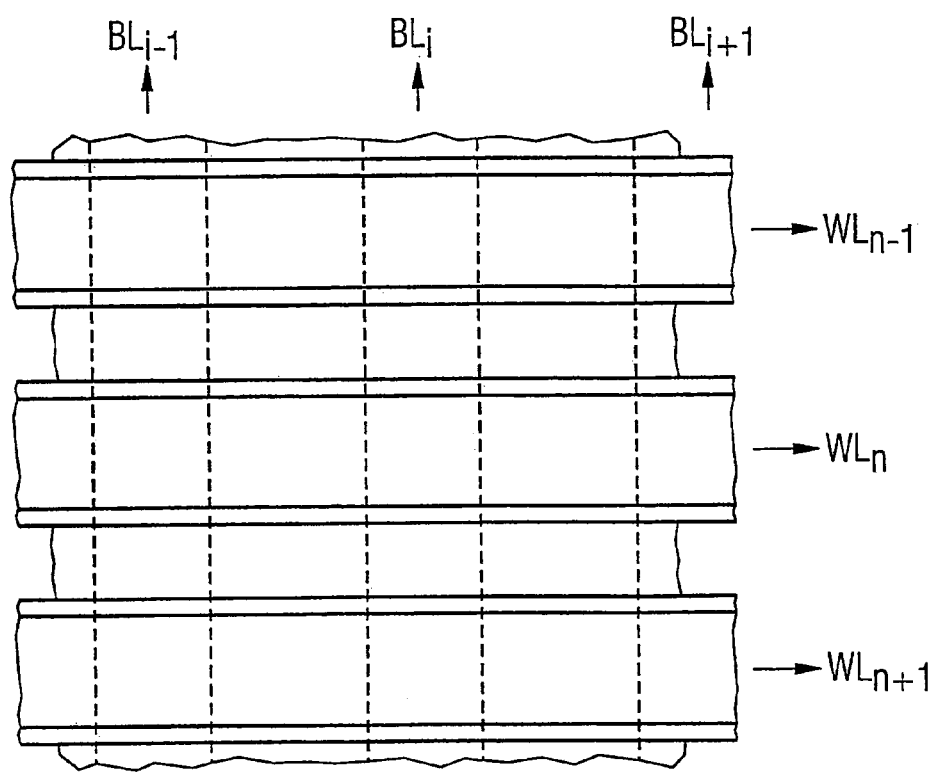
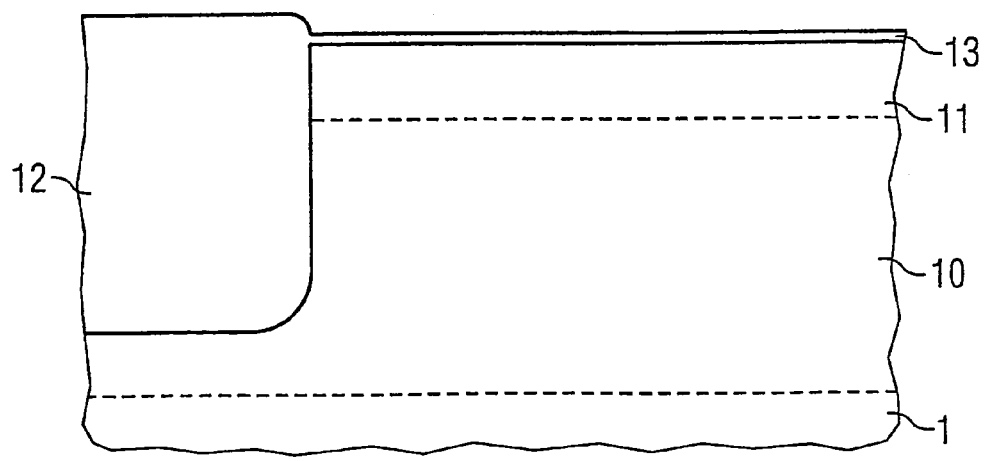

METHOD FOR FABRICATING AN NROM MEMORY CELL ARRAY

This application is a continuation of co-pending International Application No. PCT/DE03/01965, filed Jun. 12, 2003, which designated the United States and was not published in English, and which is based on German Application No. 102 29 065.2 filed Jun. 28, 2002, both of which applications are incorporated herein by reference.

TECHNICAL FIELD

The invention relates to the field of electrically writable and erasable nonvolatile flash memories. It specifies a method for fabricating an NROM memory with an arrangement of nonvolatile memory cells constructed with an oxide-nitride-oxide storage layer, which can be used in a virtual-ground NOR architecture.

BACKGROUND

Extremely small nonvolatile memory cells are required for a very large scale integration density in multimedia applications. The further development of semiconductor technology is making possible increasingly larger storage capacities, which will very soon open up the gigabit range. However, while the minimum feature size determined by the lithography continues to decrease, other parameters, such as, e.g., the thickness of the tunnel oxide, can no longer be scaled correspondingly. The decrease in the channel length, which accompanies the structural miniaturization in the case of planar transistors, requires an increase in the channel doping in order to avoid the occurrence of a voltage breakdown—referred to as punch-through—between source and drain. This leads to an increase in the threshold voltage, which is usually compensated for by reducing the thickness of the gate oxide.

However, planar SONOS memory cells (see Boaz Eitan U.S. Pat. No. 5,768,192, U.S. Pat. No. 6,011,725 and WIPO Patent Publication 99/60631) that are programmable by means of channel hot electrons and erasable by hot holes require a control dielectric having a thickness equivalent to a gate oxide. This thickness cannot be reduced arbitrarily, however, without the number of executable programming cycles ("endurance" of the memory cell) decreasing in an unacceptable manner. Therefore, a sufficiently large channel length is necessary in order that the dopant concentration in the channel does not have to be chosen to be excessively high, because otherwise the threshold voltage rises too much.

The publication by J. Tanaka et al.: "A Sub-0.1-µm Grooved Gate MOSFET with High Immunity to Short-Channel Effects" in IEDM 93, pp. 537–540 (1993) describes a transistor on a p$^+$-type substrate, in which the gate electrode is arranged in a trench between the n$^+$-type source region and the n$^+$-type drain region and a curved channel region is thus formed in the substrate.

The publication by K. Nakagawa et al.: "A Flash EEPROM Cell with Self-Aligned Trench Transistor & Isolation Structure" in 2000 IEEE Symposium on VLSI Technology digest of Technical Papers describes a transistor as memory cell with a floating gate electrode which is arranged between the n$^+$-type source region and the n$^+$-type drain region in a manner such that it reaches right into a p-type well of the substrate. A dielectric layer made of an oxide-nitride-oxide layer sequence is situated between the floating gate electrode and the control gate electrode.

SUMMARY OF THE INVENTION

It is an object of the present invention to specify how, in an NROM memory cell array with bit line webs, a lithography for patterning the gate polysilicon introduced is possible even with very small structural dimensions.

This object is achieved by means of the method wherein, at a top side of a semiconductor body or layer, dopant is introduced in order for form source/drain regions. Parallel trenches are etched into the semiconductor material and a bit line, electrically conductively connected to the source/drain regions, is arranged between the trenches. A storage layer is applied at least at the walls of the trenches. Gate electrodes are arranged in the trenches at predetermined distances and are electrically conductively connected to word lines that run transversely with respect to the direction of the bit lines. Polysilicon is then introduced into the trenches and the top side is ground back until the top side of the covering layer is reached. A polysilicon layer is then applied over the whole area and patterned to form the word lines.

In the method, firstly the trenches provided for the memory transistors are filled with the polysilicon provided for the gate electrodes. Afterward, the top side is planarized, which is preferably done by means of CMP (chemical mechanical polishing). This planarization step stops on the top side of the covering layer, which insulates the bit line webs from the word lines toward the top. The covering layer is preferably silicon nitride. Afterward, a polysilicon layer provided for the word lines is deposited onto the now planar top side. Preferably, portions of the layers applied for the bit lines are also arranged outside the memory cell array, thus facilitating a whole-area planarization of the top side after the introduction of the polysilicon for the gate electrodes. Those portions of the layer sequence provided for the bit line webs which are present outside the memory cell array are used as supporting webs or supporting pillars on whose top side made of silicon nitride the CMP grinding-back step stops.

BRIEF DESCRIPTION OF THE DRAWINGS

The method is described in more detail below using an exemplary embodiment ustrated in the figures.

FIG. 0 shows a diagrammatic arrangement of the word lines and bit lines in plan view;

FIGS. 1, 2a, 2b and 3 show cross sections through intermediate products after different steps of a preferred fabrication method;

Figure 2A:
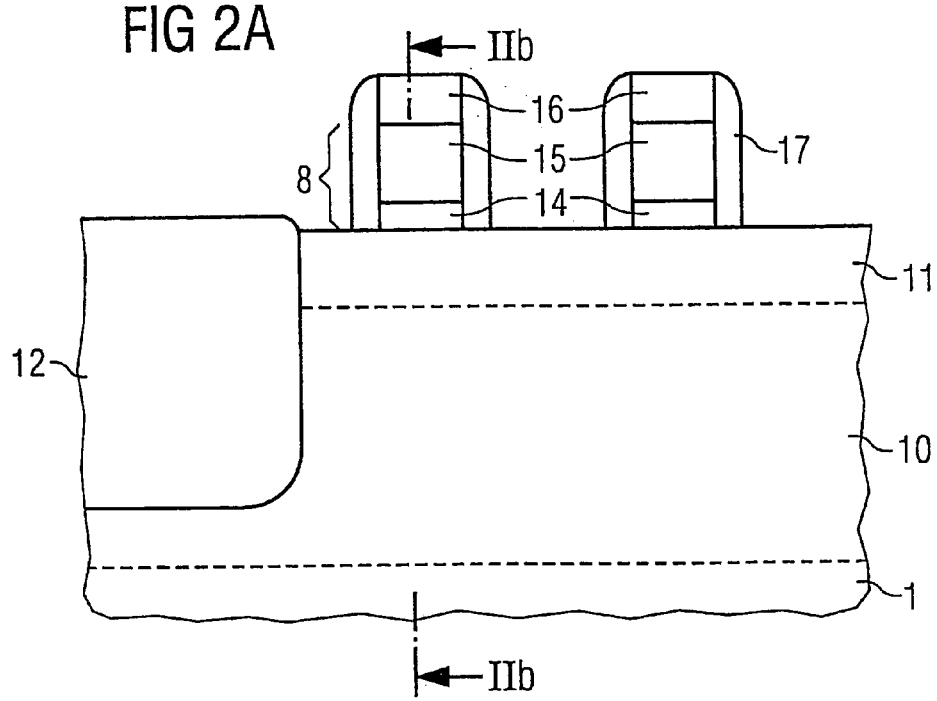

The following list of reference symbols can be used in conjunction with the figures:
1 Semiconductor body
2 Gate electrode
3 Source/drain region
4 Source/drain region
5 Boundary layer
6 Storage layer
7 Boundary layer
8 Bit line
9 Trench
10 p-type well
11 Doped region 12 Edge insulation
13 Oxide layer
14 Polysilicon layer
15 Metal-containing layer
16 Hard mask
17 Spacer
18 Polysilicon layer
19 Metal-containing layer
20 Hard mask layer
21 Spacer
22 Anti-punch implantation
23 Portion of the channel region
24 Supporting structures

DETAILED DESCRIPTION OF ILLUSTRATIVE EMBODIMENTS

German Patent Application 101 29 958 (and U.S. counterpart U.S. Pat. No. 6,548,861) describes a memory cell arrangement provided with low-impedance bit lines. Arranged on doped source/drain regions of memory transistors there is a separate layer or layer sequence which is patterned in strip form in accordance with the bit lines and, in particular as metalization, is electrically conductively connected to the source/drain regions and reduces the nonreactive resistance of the bit lines. The layer or layer sequence comprises, in particular, at least one material from the group of doped polysilicon, tungsten, tungsten silicide, cobalt, cobalt silicide, titanium and titanium silicide.

If the source/drain regions are formed in silicon, the metalization of the bit lines may be a siliconized metal layer fabricated by the method known by the designation "Salicide" as an abbreviation of self-aligned silicide. In other embodiments, preferably likewise on silicon, a layer sequence—applied as metalization—made of polysilicon and WSi or WN/W and also a covering and electrically insulating layer made of a material suitable for a hard mask, for example an oxide or nitride, are present on the source/drain regions of the memory transistors. The metalizations of the bit line structures are patterned directly on the substrate and, as required, in part above oxide-covered regions.

The source/drain regions of the individual memory transistors are fabricated with a source/drain implantation having a high dose or by means of an outdiffusion of dopant from a suitable layer, e.g., from polysilicon. The bit lines are formed with the strip-type metalizations applied on the source/drain regions, the bit lines having a particularly low nonreactive resistance owing to the good conductivity of the metalizations. In this case, a metalization is to be understood to be a metal-containing layer or an interconnect having at least metal-like properties. The source/drain regions of the same bit line need not already be electrically conductively connected to one another in the semiconductor material. Preferably, however, the bit lines are formed as buried bit lines with strip-type doped regions in the semiconductor material which are additionally provided with the metalizations.

On the top side remote from the semiconductor material, the bit line structures are preferably encapsulated in nitride layers which are embodied as strips and, in the fabrication method, serve as an etching mask for producing the transistors' channel regions that are self-aligned with respect thereto. After the application of a storage layer, which preferably comprises a layer sequence that is formed from a boundary layer, an actual storage layer and a further boundary layer and is formed in the manner of an ONO layer, a layer sequence for fabricating word lines is deposited and patterned in strip form preferably by means of a dry etching.

The boundary layers are material having a higher energy band gap than the energy band gap of the storage layer, so that the charge carriers trapped in the storage layer remain localized there. A nitride is preferably appropriate as material for the storage layer; an oxide is primarily suitable as surrounding material. In the case of a memory cell in the material system of silicon, the storage layer in the example of an ONO layer sequence is silicon nitride having an energy band gap of about 5 eV; the surrounding boundary layers are silicon oxide having an energy band gap of about 9 eV. The storage layer may be a different material whose energy band gap is less than the energy band gap of the boundary layers, in which case the difference between the energy band gaps is intended to be as large as possible for good electrical confinement of the charge carriers. In conjunction with silicon oxide as boundary layers, it is possible to use, e.g., tantalum oxide, hafnium silicate, titanium oxide (in the case of stoichiometric composition $TiO_2$), zirconium oxide (in the case of stoichiometric composition $ZrO_2$), aluminum oxide (in the case of stoichiometric composition $Al_2O_3$) or intrinsically conductive (undoped) silicon as material of the storage layer.

Between the channel regions of the transistors of adjacent memory cells, an electrical insulation can be produced by means of an implantation of dopant with a variable angle of incidence, in order to insulate the transistors from one another, a so-called anti-punch implantation. An alternative configuration provides for this insulation to be realized by cutouts filled with oxide; this is done in the manner of an STI (shallow trench isolation).

FIG. 0 diagrammatically illustrates an arrangement made of word lines $WL_{n-1}$, $WL_n$, $WL_{n+1}$ and bit lines $BL_{i-1}$, $BL_i$, $BL_{i+1}$, in a plan view. In this case, the bit lines are present as buried bit lines and depicted as concealed contours by means of broken lines. The word lines are provided as preferably metallic interconnects on the top side of the arrangement. A memory cell of the memory is arranged in a respective crossover position between a bit line intermediate region and a word line (crosspoint cell). The memory cell that is respectively to be read or programmed is addressed via the bit lines and word lines in the manner known per se. The totality of the memory cells with the illustrated connections by bit lines and word lines form a memory with virtual-ground NOR architecture.

FIG. 1 illustrates a first intermediate product of the fabrication of such a memory in a cross section. It is customary for the top side of the semiconductor material of a semiconductor body 1 used, e.g., of a substrate made of silicon, or of a semiconductor layer or semiconductor layer sequence grown on a substrate, firstly to be covered with a so-called pad oxide (screen oxide) and pad nitride. Trenches are etched into the semiconductor material, which trenches are filled with an oxide as STI (shallow trench isolation) and are provided for delimiting the memory cell array (edge insulation 12) or individual memory blocks and, if appropriate, for the purpose of insulation between the memory cells. After planarization, the pad nitride is removed by means of an etching. With the use of silicon as semiconductor material, p-type wells and n-type wells, i.e., doped regions, which reach deeply into the semiconductor material and are provided for the driving periphery and the memory cells, are fabricated preferably by means of masked boron implantations and phosphorus implantations with subsequent annealing of the implants. FIG. 1 illustrates a p-type well 10 formed in the semiconductor body 1.

After the removal of the initially applied pad oxide, an oxide layer 13 having a suitable thickness is grown, which later serves as an etching stop layer outside the memory cell array. During this fabrication process, an implantation (e.g., phosphorus) is then introduced by means of a suitable phototechnology, which implantation forms a region 11 doped in highly n-conducting fashion ($n^+$-type region) in an upper portion of the p-type well 10 which is provided for the source/drain regions that are later to be fabricated. The signs of the dopings may also be interchanged ($p^+$-type region in an n-type well). In the region of the memory cell array, the oxide layer 13, which is not necessary for forming the memory cell, is removed wet-chemically preferably using the same photomask.

FIG. 2a represents the cross section illustrated in FIG. 1 after the application and patterning of a layer sequence with the strip-type bit line 8. Firstly, for the contact connection of the source/drain regions, a polysilicon layer 14 of the associated sign of the conductivity type is applied and then a metal-containing layer 15, for example tungsten silicide (WSi) is applied as an actual low-impedance bit line and, afterward, a material of a hard mask 16 (e.g., an oxide or nitride) is applied for the purpose of electrical insulation. These layers are then patterned in strip form preferably by means of a phototechnology and anisotropic etching. Instead of the WSi, it is possible to apply a layer sequence made of tungsten nitride and tungsten. The electrically conductive layer may also have titanium and/or titanium silicide. The strip-like bit lines 8 are laterally insulated by spacers 17, preferably made of an oxide or nitride.

Figure 2B:
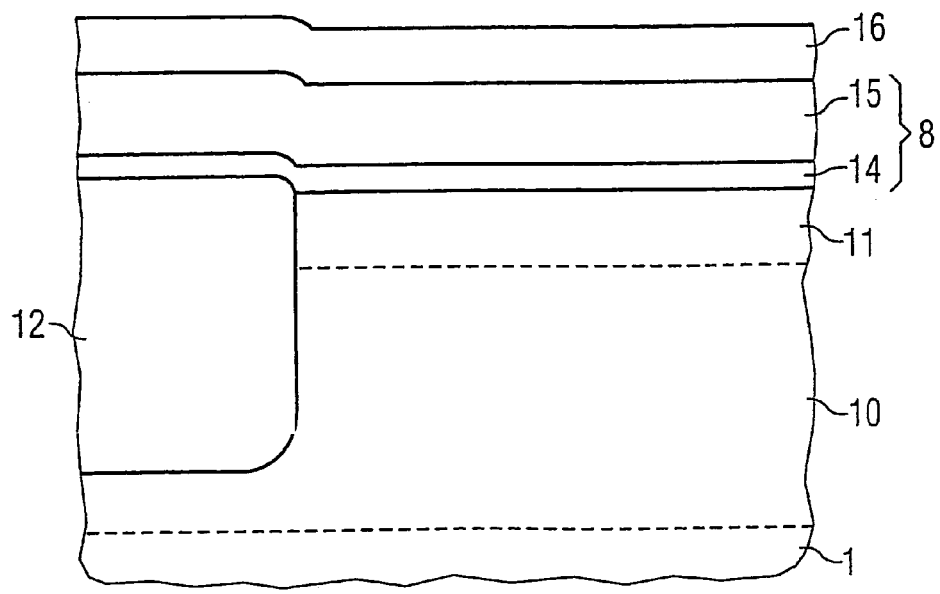

FIG. 2b illustrates the section designated in FIG. 2a. It reveals that the bit line 8 is lengthened laterally beyond the edge insulation 12, so that it can be contact-connected outside the actual memory cell array. The etching process for the strip-type patterning of the layers is delimited at the edge of the cell array by the edge insulation 12. Buried portions of the bit lines that may be present in addition to the source/drain regions as doped semiconductor material end in each case at the edge insulation 12.

Figure 3:
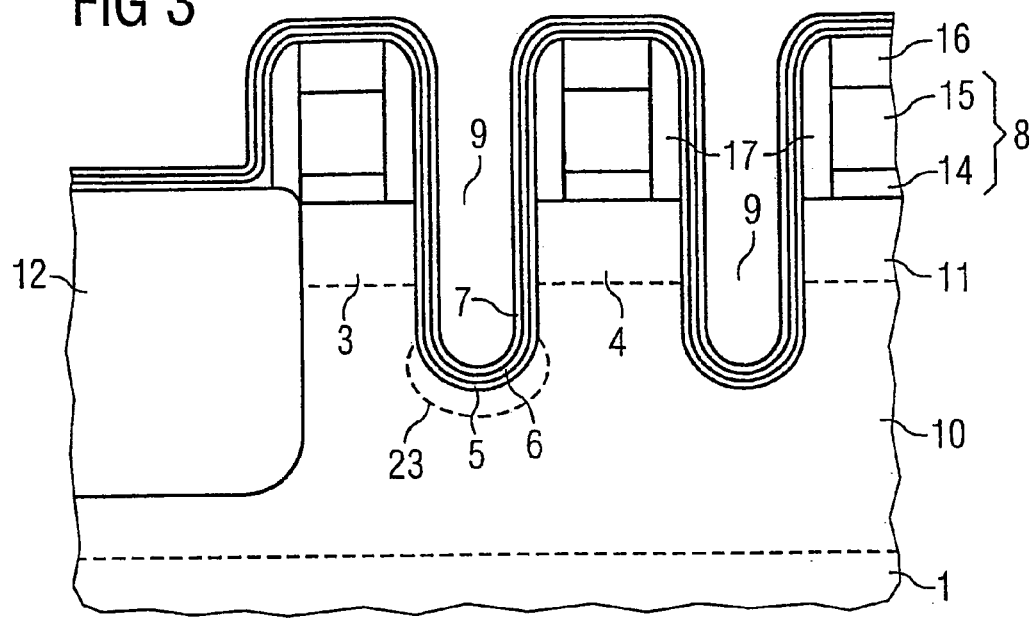

Using the bit line structures on the top side and the oxide- or nitride-covered regions as mask, trenches 9 are etched (e.g. by means of reactive ion etching, RIE), as illustrated in FIG. 3, in a self-aligned manner, which trenches are provided for the active regions, in particular the individual memory cells. The source/drain regions 3, 4 are formed in between. It must additionally be taken into account that, for good functioning (performance), the charge carrier concentration respectively present at a specific gate voltage in a portion of the channel region of the memory transistor that is provided at the bottom of the trench must be sufficiently high; that is the electron concentration in the case of a p-type well. In an advantageous configuration in which the well 10 of the memory cell has a typical dopant concentration of $10^{17}$ cm$^{-3}$, a doped region 23 is therefore formed by means of an implantation into the bottom of the trench, which doped region changes the dopant concentration of the channel region to a greater extent in the center than in the lateral outer regions. To that end, preferably a sacrificial layer is firstly applied (e.g. sacrificial oxide, typically about 6 nm thick, produced thermally). The dopant provided is then implanted; in the specified example of a p-doped well, that is arsenic as dopant having an energy of, for example, typically 20 keV in a dose of $10^{12}$ cm$^{-3}$ to $10^{14}$ cm$^{-3}$. The sacrificial layer is removed; this can be done using dilute HF in the case of an oxide.

A layer sequence comprising a lower boundary layer 5, a storage layer 6 and an upper boundary layer 7 is applied over the whole area. This layer sequence is provided as the actual storage medium and may be, as described in the introduction, e.g., an ONO layer sequence known per se. In this case, the lower boundary layer 5 may be, for example, an oxide having a thickness of about 2.0 nm to 8 nm (bottom oxide preferably produced thermally), the storage layer 6 may be a nitride having a thickness of about 1 nm to 5 nm (preferably deposited by LPCVD, low pressure chemical vapor deposition) and the upper boundary layer 7 may likewise be an oxide, having a thickness of about 3 nm to 12 nm.

The structure thus achieved is illustrated in cross section in FIG. 3. The memory cell array is covered by means of suitable phototechnology, so that the storage layer including the boundary layers can be removed in the region of the periphery, which is fabricated for example in the context of a CMOS process. The storage layer may also be removed in the region of the memory on the bottoms of the trenches 9 provided for the gate electrodes, and/or between the trenches 9, so that the storage layer is interrupted between the walls of a respective trench and/or between two mutually adjacent trenches. For the driving periphery, the gate oxide is grown for high-voltage transistors and then possibly a thinner gate oxide is grown for low-voltage transistors. The threshold voltages can be set using further masks and implantations.

Figure 4A:
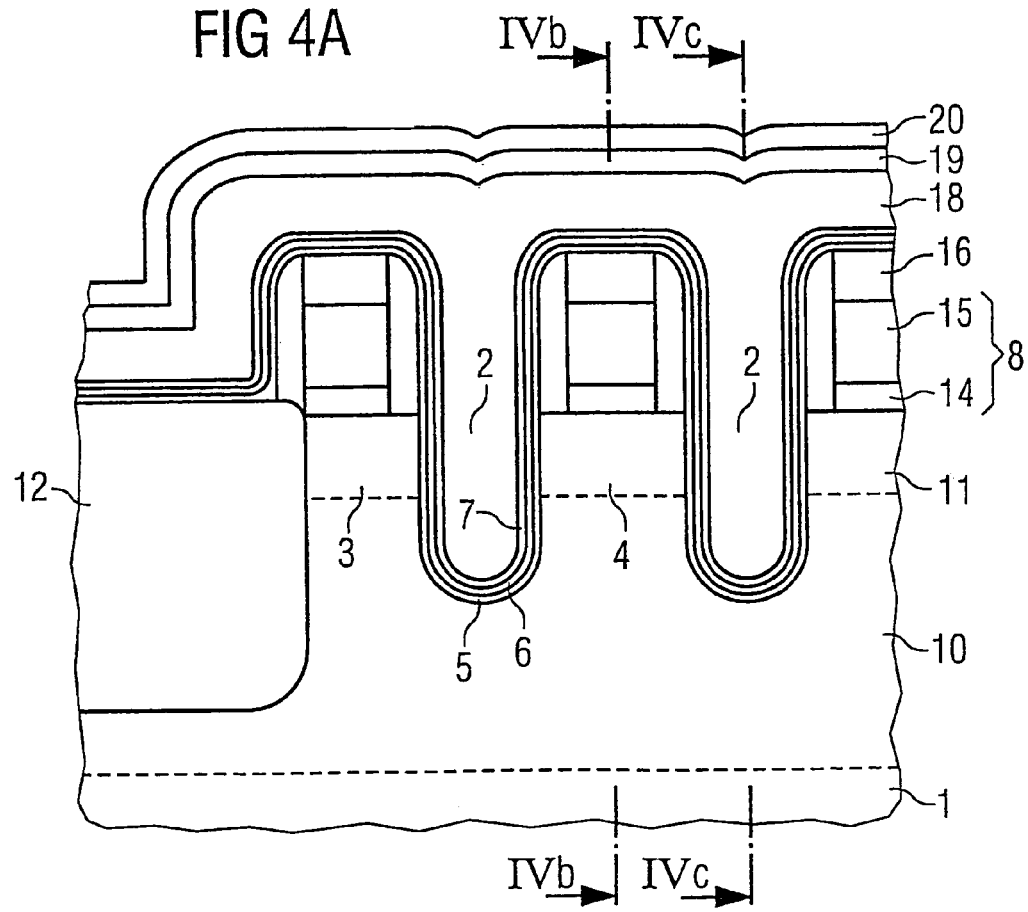
FIGS. 4a, 4b and 4c show cross sections through an intermediate product after further steps of the fabrication method described.

In the cross section illustrated in FIG. 4a, the structure is illustrated after the deposition of a conductively doped polysilicon layer 18 provided for the gate electrodes 2 and of a metal-containing layer 19 (here WSi) provided for the word line and of a hard mask layer 20. The polysilicon is deposited with a thickness of typically 80 nm and is preferably doped in situ and is provided for the gate electrodes. The actual word lines are formed by the low-impedance metallic or metal-containing material of the metal-containing layer 19. Instead of tungsten silicide, a silicide of a different metal or a multilayer metal-containing layer may be present. The material of the hard mask layer 20 is, e.g., a densified oxide.

Figure 4B:
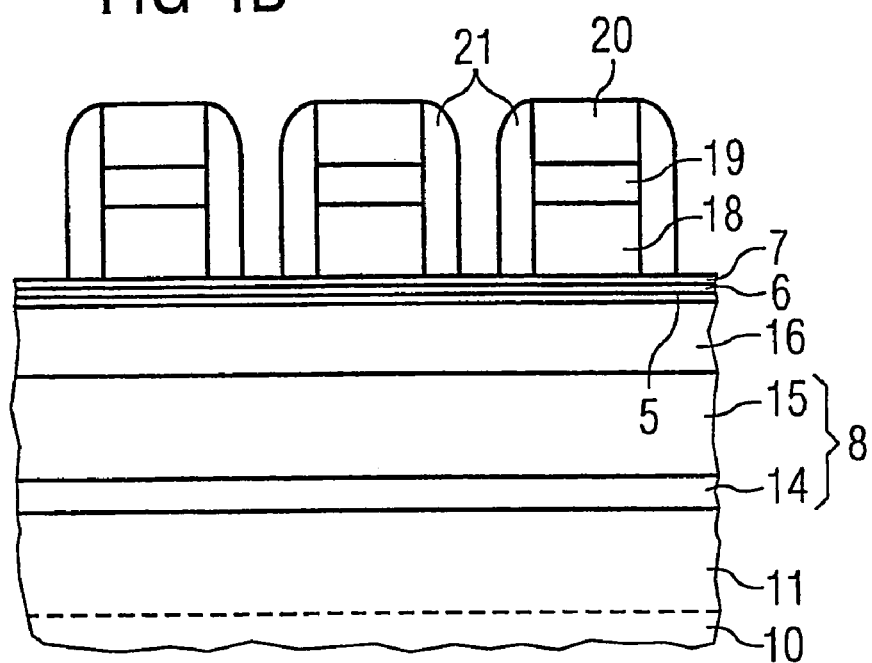
Figure 4C:
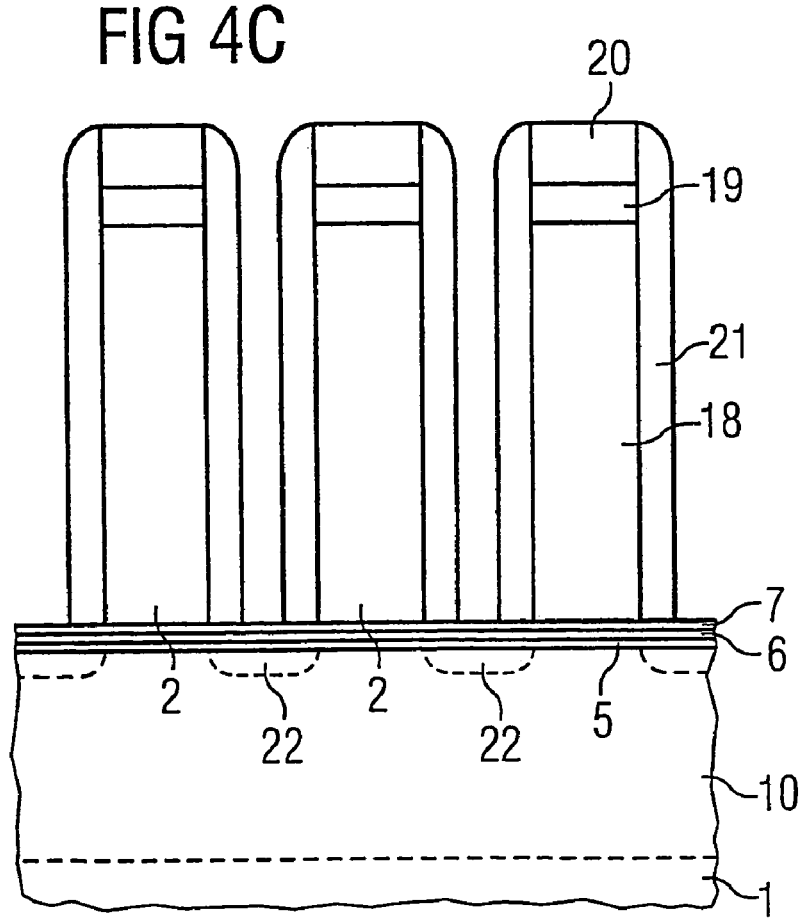

FIG. 4b and FIG. 4c illustrate the sectional views depicted in FIG. 4a. In the cross section of FIG. 4b, the layer sequence of the storage layer 6 is situated between the boundary layers 5, 7 above the bit layer 8, which, in this example, is formed from the polysilicon layer 14 and the metal-containing layer 15, and insulated therefrom by the hard mask 16. FIG. 4c illustrates a section through the gate electrode 2 between two bit lines, where the storage layer 6 runs at the bottom of the trenches provided for the gate electrodes. As can be discerned in FIGS. 4b and 4c, the applied layer sequence made of the polysilicon layer 18, the metal-containing layer 19 and the hard mask layer 20 is patterned in strip form, so that word lines running transversely with respect to the bit lines are formed. The sidewalls of the word lines are insulated by spacers 21. The spacers are formed in the manner known per se by a layer comprising the material of the spacers being applied isotropically over the whole area and being etched back anisotropically in such a way that essentially only the high vertical portions of the spacers 21 remain at the sidewalls of the word lines etched in strip form. The interspaces between the gate electrodes below the word lines may, instead, remain filled entirely or partly with the material of the spacers.

The gate electrodes of the transistors of the driving periphery may be patterned at the same time in this method step. In the region of the memory cell array, the etching of the gate electrode stops on the upper boundary layer 7 or the ONO layer sequence. In a supplementary manner, a gate reoxidization may be effected and, as required, an antipunch implantation 22 may be introduced for the insulation of adjacent transistors.

Further customary method steps known per se for the fabrication of the transistors may equally be provided, such as, e.g., LDD implantations (lightly doped drain) and HDD implantations or a deposition of a passivation made of nitride and a planarization by means of BSG (borophosphosilicate glass) and CMP. Further steps for completion consist in the fabrication and filling of contact holes (via holes) and the fabrication of metalizations and passivations. These fabrication steps are known per se from the fabrication of memory components.

In an embodiment of the bit lines as strip-type metalization on the top side of the semiconductor body, the problem arises that the top side of the intermediate product is uneven during the lithography for fabricating the gate electrodes and the word lines. The height difference in the polysilicon layer 18 between the memory cell array and the periphery is critical for the lithography. Owing to the bit line webs, the step depicted on the left in FIG. 4a occurs between that portion of the polysilicon layer 18 which covers the memory cell array and the lateral portion of the polysilicon layer at the periphery of the memory cell array. A planar surface prior to the lithography is necessary, however, in the case of the increasingly smaller structures sought in the region of scales of less than 140 nm. Otherwise, during the etching, the material of the metal-containing layer 19 (in particular silicide) remains at the step, so that all the word lines are short-circuited.

The cross section illustrated in FIG. 4a reveals that the top side of the polysilicon layer 18 provided for the word lines in the conventional fabrication is not planar, but rather forms a step toward the periphery and undulates at least above the gate electrodes 2 introduced into the trenches. Instead of depositing the polysilicon for the gate electrodes and the word lines in one method step, firstly, in accordance with the cross section of FIG. 5, the polysilicon for the gate electrodes 2 is introduced into the trenches. Afterward, the polysilicon is ground back by means of CMP, so that the top side of the component is situated, preferably over the whole area, at the level of the top side of the covering layer (hard mask 16) of the bit line webs. The hard mask is a silicon oxide or, preferably, a silicon nitride. The polysilicon layer 18 provided for the word lines can then be applied to a planar top side and likewise produces a planar top side to which the subsequent layers (in this example the metal-containing layer 19 and the further hard mask layer 20) can then be applied. A sufficiently planar top side is thus present for the subsequent lithography step for patterning the gate electrodes and the word lines.

Figure 5:
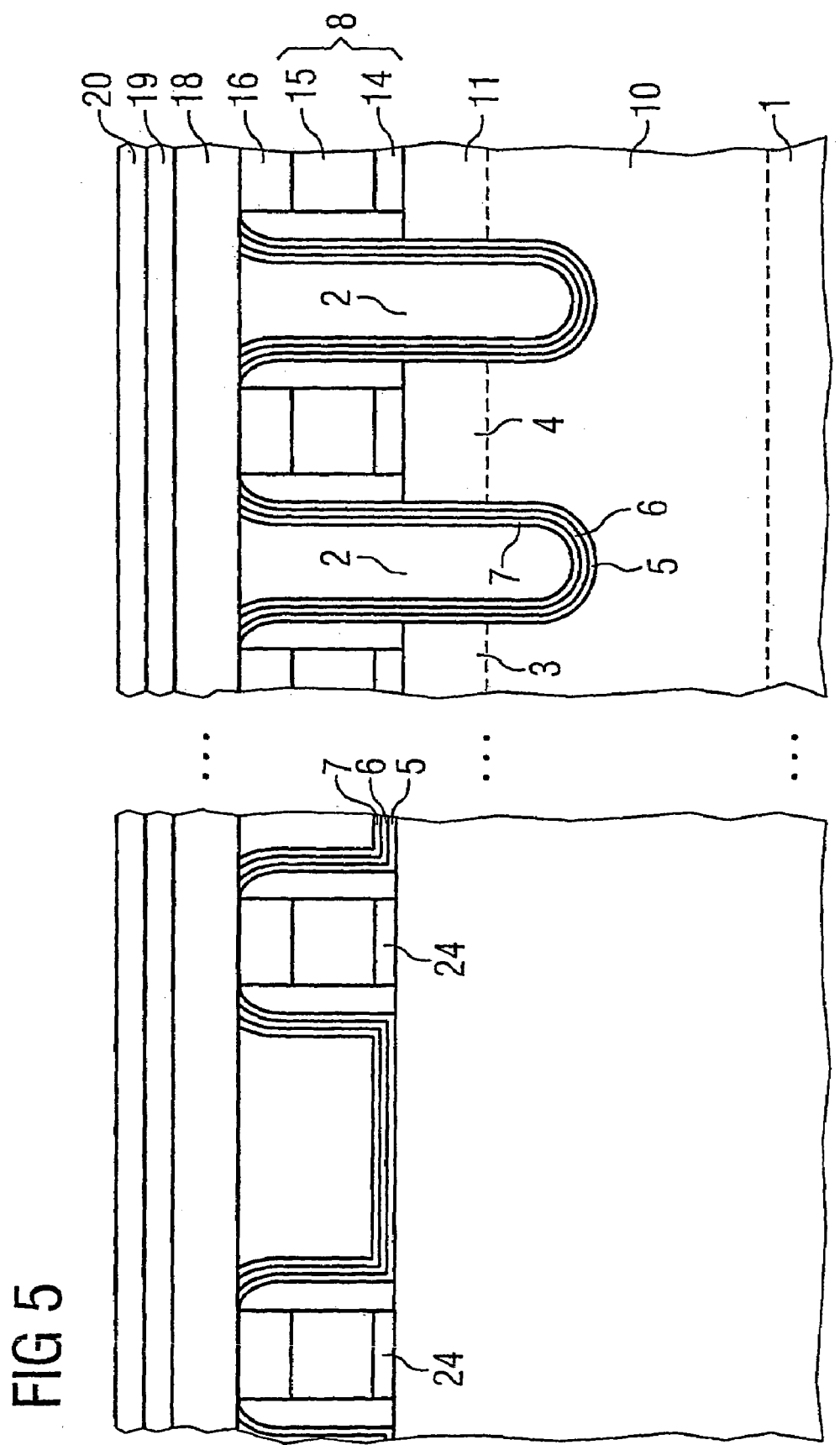
FIG. 5 shows a cross section—corresponding to FIG. 4a—through an intermediate product after further steps of an improved fabrication method.

A region of the component outside the memory cell array is illustrated on the left-hand side in FIG. 5. In a preferred exemplary embodiment, supporting structures 24 are provided in this region, which structures may be, e.g., webs or pillars and are preferably formed from portions of the layers applied for the bit line webs. The supporting structures 24 serve for achieving a planar top side of the polysilicon layer 18 over the whole area. The supporting structures 24 are preferably fabricated by a procedure in which, during the patterning of the bit lines 8, the layer sequence provided therefor (here the polysilicon layer 14, the metal-containing layer 15 and the hard mask 16) is not completely removed outside the memory cell array, but rather is patterned to form the supporting structures 24 in the manner illustrated. The layer sequence comprising the boundary layer 5, the storage layer 6 and the boundary layer 7 is also depicted in the region of the supporting structures 24 in FIG. 5. However, this layer sequence may remain limited to the memory cell array by means of a suitable masking, since it is not necessary for the supporting structures 24.

In this case, the arrangement and form of the supporting structures 24 can largely be adapted to the requirements of the process step of the planarization and the arrangement of the circuit components present outside the memory cell array. In this case, in particular the arrangement of the components of the driving periphery and also the size of the surface to be planarized are to be taken into account.

What is claimed is:

1. A method for fabricating an NROM memory cell array, the method comprising:
    introducing dopant at a top side of a semiconductor body, in order to form source/drain regions;
    etching trenches arranged parallel at a distance from one another into the semiconductor body;
    forming bit lines running parallel to the trenches and arranged between adjacent ones of said trenches on the top side of the semiconductor body, each bit line being electrically conductively connected to source/drain regions located between the adjacent ones of the trenches;
    forming supporting structures outside a memory cell array region, the supporting structures being formed concurrently with the bit lines;
    applying a covering layer on the top side of the bit lines;
    applying a storage layer to the walls of the trenches;
    filling the trenches with conductive gate electrode material;
    after filling the trenches, removing the top side of said conductive gate electrode material in a planarizing manner until a top side of the covering layer is reached, wherein the supporting structures serve to support the planarizing outside the memory cell array region;
    after removing the material, depositing conductive word line material; and
    patterning the conductive word line material to form word lines that run transversely with respect to the direction of the bit lines, the word lines being electrically conductively coupled to gate electrode disposed within the trenches.

2. The method as claimed in claim 1, wherein removal of the material is performed by means of chemical mechanical polish (CMP).

3. The method as claimed in claim 2, wherein applying a covering layer comprising forming a nitride or oxide layer over the bit lines.

4. The method as claimed in claim 3, wherein the covering layer is used as a stop layer during the removal of the conductive gate electrode material.

5. The method as claimed in claim 4 wherein the conductive gate electrode material comprises polysilicon.

6. The method as claimed in claim 1, wherein applying a covering layer comprising forming a nitride or oxide layer over the bit lines.

7. The method as claimed in claim 6, wherein the covering layer is used as a stop layer during the removal of the conductive gate electrode material.

8. The method as claimed in claim 7, wherein the conductive gate electrode material comprises polysilicon.

9. The method as claimed in claim 1, wherein the conductive gate electrode material comprises polysilicon.

10. The method as claimed in claim 9, wherein the conductive word line material comprises polysilicon.

11. A method for fabricating a memory cell in an active region, the method comprising:
   patterning at least one film of an electrically conductive layer to form strip-like sections on a semiconductor material;
   forming at least one support structure outside of said active region on said semiconductor material, said at least one support structure being formed concurrently with the forming of said strip like sections;
   forming a doped region for a source and a doped region for a drain;
   forming a trench having sides between the strip-like sections of the electrically conductive layer such that the doped region for the source remains at one of the sides of the trench and the doped region for the drain remains at another one of the sides of the trench;
   applying a boundary layer, a memory layer arid a boundary layer on top of one another over an entire surface of the semiconductor material;
   introducing an electrically conductive material for a gate electrode into the trench;
   planarizing an upper surface of the electrically conductive material, wherein said at least one structure serves to support the step of planarizing; and
   forming electrically conductive word lines over the planarized upper surface.

12. The method of claim 11 wherein the semiconductor material comprises a semiconductor layer.

13. The method of claim 11 wherein forming a doped region for a source and a doped region for a drain comprises performing an implantation.

14. The method of claim 11 wherein forming a doped region for a source and a doped region for a drain comprises diffusing dopant out of a material of the electrically conductive layer.

15. The method of claim 11, wherein the electrically conductive material comprises polysilicon.

16. The method of claim 15, wherein forming word lines comprises depositing and patterning polysilicon.

17. The method of claim 11 wherein the planarizing step comprises performing a chemical mechanical polish (CMP).

18. The method of claim 11 and further comprising forming a covering layer over the electrically conductive film, the covering layer being formed into strip-like sections along with the electrically conductive film.

19. The method of claim 18 wherein the covering layer is used as a mask during the forming of a trench.

* * * * *

UNITED STATES PATENT AND TRADEMARK OFFICE
CERTIFICATE OF CORRECTION

PATENT NO.        : 7,094,648 B2                                              Page 1 of 1
APPLICATION NO. : 10/023041
DATED             : August 22, 2006
INVENTOR(S)       : Deppe et al.

It is certified that error appears in the above-identified patent and that said Letters Patent is hereby corrected as shown below:

Column 9, line 17; delete "layer arid" insert --layer and--

Signed and Sealed this

Fifth Day of December, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,094,648 B2 | Page 1 of 1 |
| APPLICATION NO. | : 11/023041 | |
| DATED | : August 22, 2006 | |
| INVENTOR(S) | : Deppe et al. | |

It is certified that error appears in the above-identified patent and that said Letters Patent is hereby corrected as shown below:

Column 9, line 17; delete "layer arid" insert --layer and--

This certificate supersedes Certificate of Correction issued December 5, 2006.

Signed and Sealed this

Second Day of January, 2007

JON W. DUDAS
*Director of the United States Patent and Trademark Office*